United States Patent [19]

Rutishauser

[11] 4,197,558

[45] Apr. 8, 1980

[54] OVERLOAD PROTECTION CIRCUIT FOR VIDEO AMPLIFIERS

[75] Inventor: Ernst A. O. Rutishauser, Widen, Switzerland

[73] Assignee: RCA Corporation, New York, N.Y.

[21] Appl. No.: 960,930

[22] Filed: Nov. 15, 1978

[30] Foreign Application Priority Data

Feb. 16, 1978 [GB] United Kingdom ............... 06260/78

[51] Int. Cl.² .......................... H04N 5/14; H03F 3/04
[52] U.S. Cl. ..................................... 358/39; 358/184; 330/207 P; 330/298
[58] Field of Search ............... 358/160, 167, 174, 175, 358/184, 188, 21, 39; 330/254, 260, 278, 279, 284, 298, 207 P

[56] References Cited

U.S. PATENT DOCUMENTS 3,984,631  10/1976  Avicola ................................. 358/904
4,091,420  5/1978  Kataoka ............................... 358/184

Primary Examiner—Robert L. Richardson

Attorney, Agent, or Firm—Eugene M. Whitacre; William H. Meagher; Ronald H. Kurdyla

[57] ABSTRACT

A protection circuit for limiting the power dissipation of a video output amplifier when high frequency signals of significant magnitude and with a high density of occurrence (e.g., noise during vacant channel reception) are supplied to the amplifier. The protection circuit includes a control transistor and a sensing network. The sensing network monitors a video signal coupling path to detect the presence of high frequency signals, and derives a voltage representative thereof. The derived voltage is insufficient to render the control transistor operative under normal signal conditions. Under abnormal conditions when significant amounts of high frequency signals with a high density of occurrence are present, the derived voltage is sufficient to render the control transistor operative to develop an output control voltage. The control voltage is applied to the video signal path so as to attenuate the signal including the high density components, such that excessive conduction and power dissipation of the amplifier in response to the high density components is limited.

9 Claims, 3 Drawing Figures

OVERLOAD PROTECTION CIRCUIT FOR VIDEO AMPLIFIERS

This invention relates to an overload protection circuit for transistor video amplifiers which may be employed as output driver amplifiers in a video signal processing system such as a television receiver or an equivalent system. In particular, the protection circuit provides amplifier overload protection in the presence of excessive high frequency components in the signal supplied to the amplifier.

Video signal processing systems such as a television receiver typically employ one or more transistor video signal amplifier stages for supplying video output signals to intensity control electrodes of an image reproducing kinescope. Although relatively high power transistor devices have been employed in these video signal amplifiers (e.g., Class A amplifiers), more recently such high power stages have been replaced by relatively lower power video output stages (e.g., including transistors arranged for Class B or C operation) in order to reduce the power consumption of television receivers. The lower power stages typically are arranged to exhibit lower quiescent power dissipation compared to Class A stages, for example.

Low power transistors can be employed in the low power output stages since stages of this type exhibit power dissipation which is substantially proportional to the magnitude of the signal to be amplified. However, low power transistors are susceptible to overload when the signals processed by these stages include significant amounts of high frequency components with a high density of duration. An overload may occur, for example, when weak signals containing significant amounts of noise are amplified, or when the receiver is switched to a vacant channel containing no video information. In these instances, the noise is amplified by the intermediate frequency stages and following amplifier stages, which typically operate at maximum gain under these conditions due to the automatic gain control (AGC) action of the receiver. The noise typically encompasses the entire video signal frequency spectrum, and can occur without interruption during the entire image cycle (i.e., during both image trace and retrace blanking intervals). This continuous stream of noise results in the amplifier stage conducting virtually continuously, thereby causing the power dissipation and operating temperature of the amplifier stage to increase over a period of time. This in turn can lead to destruction of the amplifier due to the phenomenon of thermal runaway (i.e., overheating of the transistors forming the amplifier stage). Under certain signal conditions (e.g., vacant channel reception), the power dissipation can be many times above that experienced under normal signal reception conditions. Excessive power dissipation can also occur when the signal to be amplified is representative of complex image patterns such as may be reproduced by a television receiver employed in conjunction with a "video games" system, or when nonstandard test patterns are used.

Current limiting circuits associated with each amplifier subject to overload under the conditions mentioned above are considered disadvantageous for several reasons. Circuits of this type typically cannot distinguish between video information and noisy signals or noise alone, and therefore can be expected to undesirably limit peak signal currents representative of video information. These circuits also commonly require at least one relatively large and costly high voltage power transistor. Moreover, three such circuits would be required in the case of a color television receiver having three driver amplifiers for supplying amplified, color representative video signals to respective intensity control electrodes of the kinescope.

The use of heatsinks for low and medium power video output stages to compensate for the excessive power dissipation under the described conditions is also disadvantageous. Heatsinks are relatively large and costly, and can compromise the high frequency response of the output stages due to capacitance loading of the video output signal.

An automatic gain control (AGC) voltage derived from AGC circuits commonly employed in television receivers is not suitable as a means for providing an indication of the abnormal signal conditions likely to cause excessive power dissipation, since this voltage typically does not discriminate between normal and abnormal signal conditions (e.g., between normal signal reception and vacant channel reception). Accordingly, the AGC voltage is unsuitable as a means for controlling the operation of the video output stages to limit excessive power dissipation due to abnormal overload conditions.

A circuit for providing amplifier overload protection in the presence of abnormal complex signals, noisy signals, and noise alone (e.g., due to loss of signal or when the receiver is set to a vacant channel) desirably should avoid the disadvantages mentioned above, while at the same time being relatively economical and uncomplicated. The circuit should be capable of discriminating between normal and abnormal signals, and should react to potentially destructive long term signal conditions capable of overloading the video amplifier stage, rather than to relatively short term signal overload conditions. A circuit which achieves these results is provided in accordance with the present invention.

A protection circuit in accordance with the present invention is included in a video signal processing system comprising a video signal transmission path including a video signal amplifier. The video amplifier is undesirably susceptible to excessive conduction and dissipation when the input signal to the amplifier contains high frequency components of a significant magnitude and with a high density of occurrence. The protection circuit includes an input network coupled to the video signal path and selectively responsive to high frequency signals for deriving a signal indicative of the presence of high frequency signals. A controllable conduction device is responsive to the derived signal for providing an output control signal when the derived signal exceeds a given level indicative of the presence of high frequency components of a significant magnitude and with a high density of occurrence. The control signal is applied to the video signal path to vary the gain thereof, and thereby the level of video signal, in a direction to reduce the magnitude of the video signal. The conduction and dissipation of the video amplifier in response to the high density high frequency components is correspondingly reduced.

Figure 1:
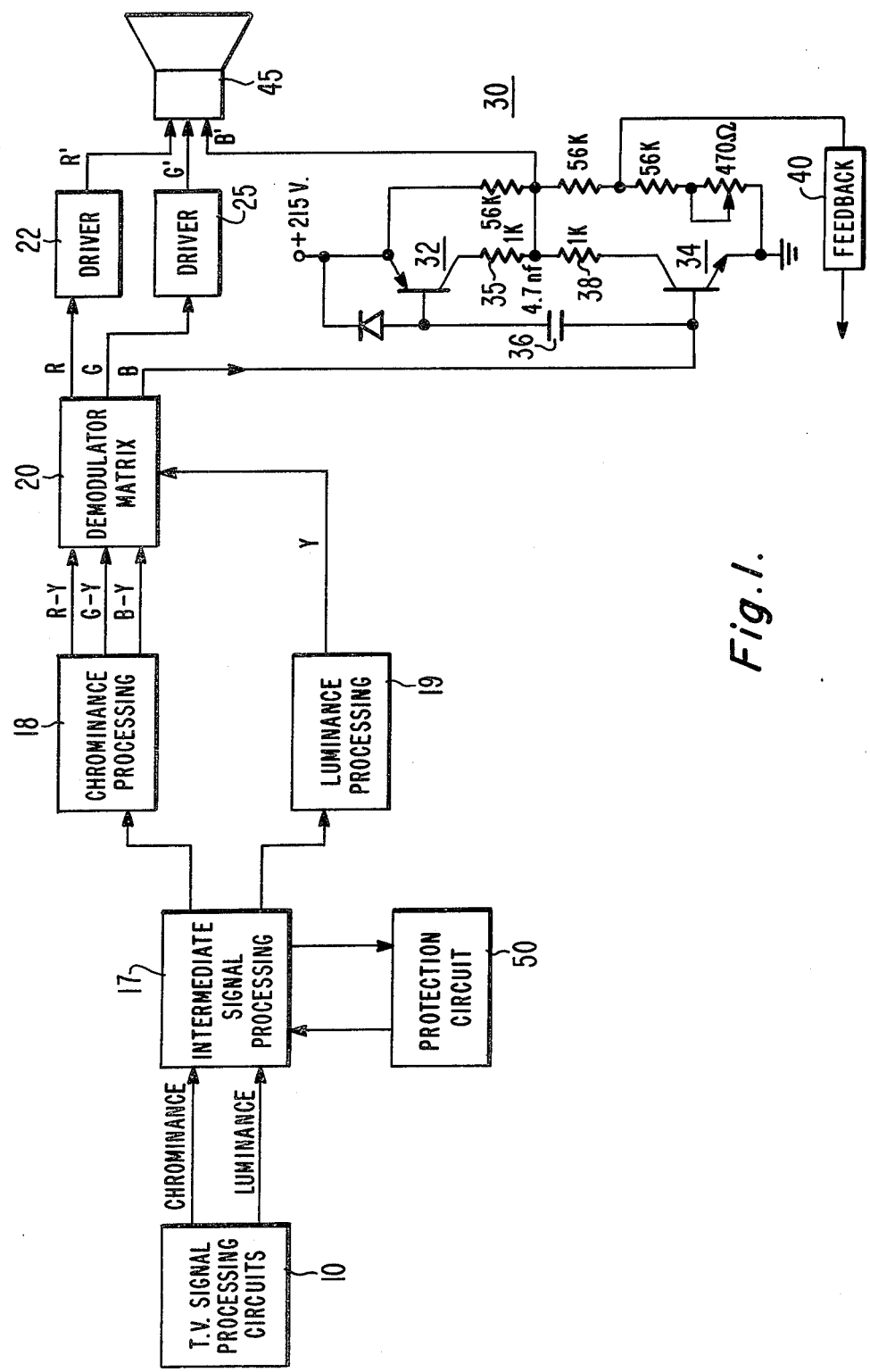
FIG. 1 illustrates a diagram, partially in block form and partially in schematic circuit diagram form, of a portion of a color television receiver including a protection circuit according to the present invention.

Referring to FIG. 1, television signal processing circuits 10 including, for example, intermediate frequency amplifier and video detector stages, and frequency selection networks, provide output luminance and chrominance signal components (and other appropriate signals) to inputs of an intermediate signal processing unit 17. In this example, unit 17 corresponds to the TDA 2560 integrated circuit which is shown and discussed in more detail in connection with FIG. 2. Chrominance and luminance components from the outputs of processor 17 receive further amplification and processing from a chrominance signal processor 18 and a luminance signal processor 19, respectively. Chrominance processor 18 develops R-Y, G-Y and B-Y color difference signals which are combined with an amplified luminance signal Y from unit 19 in a demodulator-matrix 20 to provide R, G and B color video signals (i.e., red, green and blue color image representative signals). These signals are then amplified by similar, low power video driver stages 22, 25 and 30, the latter stage being shown in circuit form.

Amplifier 30 comprises a pair of complementary conductivity type transistors 32 and 34 arranged as a push-pull video amplifier. Transistors suitable for use as transistors 32 and 34 include the types BF 470 and BF 469, respectively. Video signal B from the output of matrix 20 is coupled to a base input of NPN transistor 34, and to a base input of PNP transistor 32 via a capacitor 36. An amplified output signal B' of stage 30 appears at the junction of collector resistors 35 and 38 of transistors 32 and 34. A network 40 provides degenerative feedback for amplifier 30. Feedback network 40 can comprise a resistive voltage divider for example, and can be coupled via appropriate circuits to the base input of transistor 34 or to an input of a preamplifier stage (not shown) prior to stage 30, such as may be included in unit 20. Feedback network 40 may include video signal black and white level adjusting circuits, as well as frequency selective feedback to provide signal peaking at one or more selected video signal frequencies. The amount of A.C. and D.C. feedback can be varied to adjust the circuit gain and operating point.

Video amplifiers 22 and 25 are similar to amplifier circuit 30 including network 40. Amplified video signals R', G' and B' from amplifiers 22, 25 and 30 are respectively applied to intensity control electrodes (e.g., cathodes) of a color kinescope 45.

The arrangement of FIG. 1 also includes a protection circuit 50 coupled to intermediate signal processor 17. Protection circuit 50 serves to control the amplitude of the signals processed by the luminance signal processing portion of unit 17 in the presence of abnormal signal conditions such as excessive noise likely to damage the transistors comprising push-pull amplifiers 22, 25 and 30 (e.g., transistors 32 and 34 of amplifier 30). Although the receiver arrangement of FIG. 1 includes three push-pull amplifiers 22, 25 and 30 susceptible to damage under these conditions, a single protection circuit 50 (as will be described) provides the desired protection for all three amplifiers, since the protection circuit is associated with the luminance signal path which is common to each of the driver amplifier stages.

Figure 2:
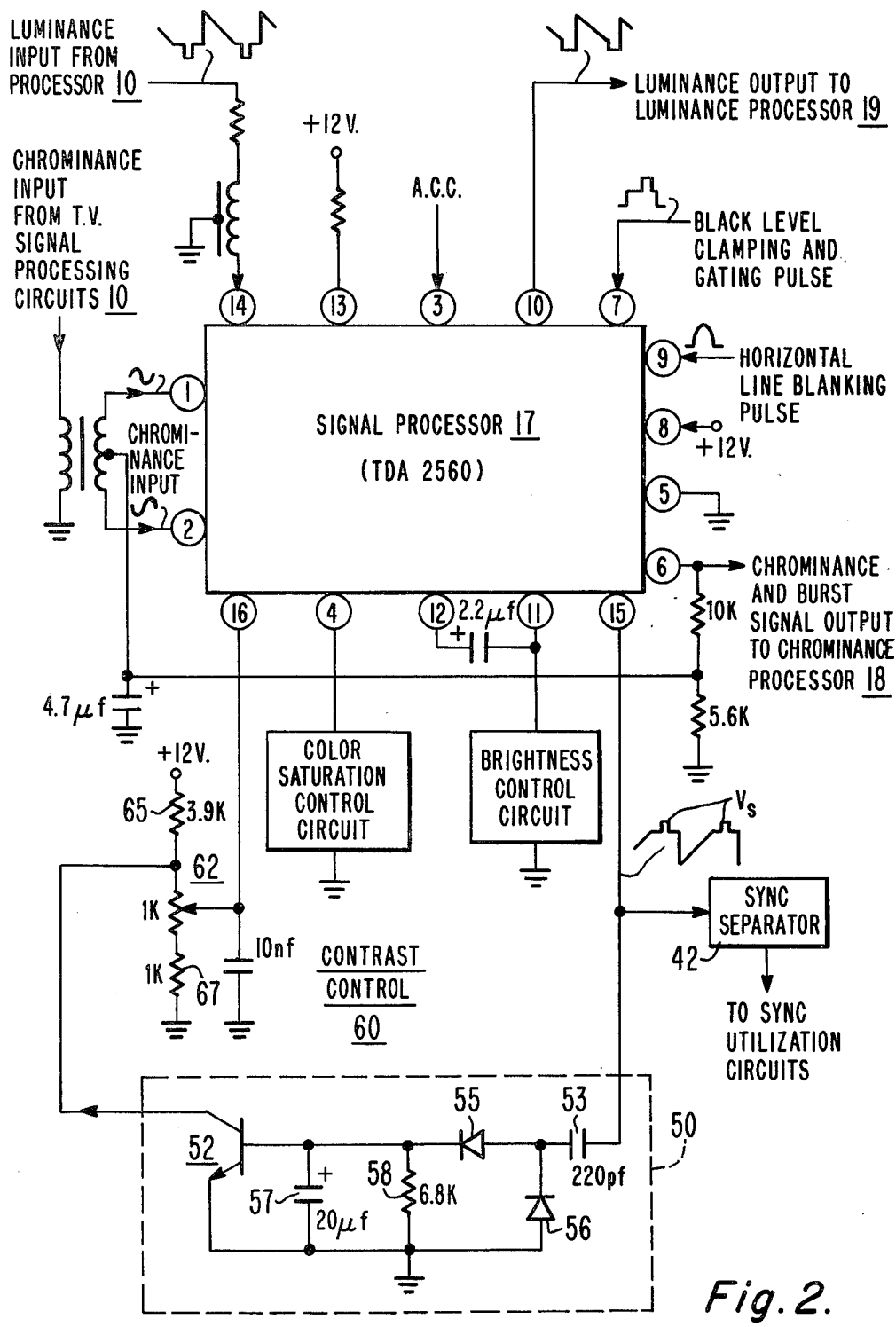
FIG. 2 depicts a portion of FIG. 1 in more detail, including a circuit constructed in accordance with the present invention.

Intermediate signal processing stage 17 and associated protection circuit 50 are shown in greater detail in FIG. 2. In FIG. 2, signal processing unit 17 is represented by a TDA 2560 video signal processing integrated circuit which is available from Mullard Limited of London, England. Integrated circuit signal processor 17 includes a plurality of external terminals numbered 1 through 16 for coupling various signals and operating voltages between processor 17 and other circuits of the receiver, as labeled. These numbered terminals correspond to the actual numbered terminals of the TDA 2560. In the interest of brevity only those portions of processor 17 which are associated with protection circuit 50 and thereby relevant to an understanding of the present invention will be described.

Protection circuit 50 comprises a normally non-conductive common emitter control transistor 52 having a base input for receiving a sample of the signal appearing at terminal 15 of unit 17, and a collector output D.C. coupled to a contrast control circuit 60. Contrast control 60 includes a manually adjustable contrast potentiometer 62 coupled between a source of direct voltage (+12 volts) and ground by means of voltage divider resistors 65 and 67. A wiper of potentiometer 62 is coupled to a contrast control input terminal 16 of integrated circuit processor 17, which in turn is coupled to signal gain control circuits within processor 17 for varying the amplitude and thereby the contrast of the luminance signals processed by unit 17 in accordance with the setting of potentiometer 62. The collector of control transistor 52 is coupled to the junction of resistor 65 and potentiometer 62.

The signal appearing at terminal 15 of unit 17 is relatively unprocessed by unit 17 (i.e., unaffected by the contrast and brightness controls associated with unit 17), and is coupled to a sync separator 42 for separating the sync component of the luminance signal in known fashion. The signal from terminal 15 is coupled to transistor 52 via an A.C. coupling capacitor 53 and a rectifier diode 55. Capacitor 53 together with the impedances of the associated circuit elements comprises a signal differentiating network for differentiating the signals coupled from terminal 15. A diode 56 coupled between the anode of diode 55 and ground serves to clamp negative-going amplitude portions of the differentiated signal coupled via capacitor 53. A charge storage integrator capacitor 57 and a bleeder resistor 58 are coupled between the base of transistor 52 and ground.

The signal at terminal 15 of unit 17, from which the chrominance and sound carrier signals have been removed, is inverted relative to the input luminance signal applied to terminal 14, and includes positive-going sync pulses $V_S$ disposed on a pedestal level (approximating the image black level) and occurring during each horizontal line blanking interval, and relatively negative-going image portions between blanking intervals. In this example, the luminance signal appearing at terminal 15 exhibits a nominal peak-to-peak amplitude of approximately three to four volts, including a sync pulse peak-to-peak amplitude of approximately one volt. The differentiated signal which is coupled via capacitor 53 is rectified by diode 55 to provide a reference voltage for the protection circuit.

Only high frequency signal amplitude transitions are passed by differentiator capacitor 53. Thus capacitor 53 will pass high frequency noise when present, as well as high frequency amplitude transitions of both normal video signals and video signals representative of complex patterns or images to be reproduced in a "video games" system. In this connection, it is noted that the high frequency signal density of a normally expected video signal and that of noise are not the same. The nature of normal high frequency components of a video signal can be considered as being sporadic in the time domain, whereas in contrast high frequency noise components can be considered as relatively continuous in the time domain. Similarly, image patterns in a video games system are often continuous in the time domain compared to normally received television signals.

Diode 56 (e.g., type 1N914) clamps negative-going amplitude peaks of the differentiated signal from capacitor 53 to approximately 0.7 volts. Rectifier diode 55 preferably is a germanium type (e.g., type OA 91) having a low threshold conduction level to minimize the voltage drop of the rectified, clamped signal. Filter capacitor 57 integrates the rectified signal from diode 55 to develop a D.C. reference voltage at the base of transistor 52. The arrangement of clamp diode 56 and rectifier diode 55 with capacitors 53 and 57 provides an appropriate reference voltage at the base of transistor 52 indicative of the presence of normal video signals or abnormal signals such as high frequency components occurring with a high density of duration (hereinafter referred to as high density signals). Since the reference voltage developed at the base of control transistor 52 is primarily derived from the rectified positive-going portion of the video signal (which primarily includes the sync pulse), this arrangement provides a significant differential between a reference voltage at the base of transistor 52 due to normal signals, and a reference voltage attributable to the abnormal high density signals, particularly under low level signal conditions.

The base-emitter threshold conduction level of normally non-conductive transistor 52 is exceeded only in the presence of the high density signals from terminal 15 of sufficiently large amplitude, since only such signals can cause capacitor 57 to charge sufficiently to render transistor 52 conductive when it is desired to compensate for these signals, as will now be discussed.

Under normal signal conditions, transistor 52 is nonconductive due to insufficient base bias. Specifically, the high frequency components of the positive portion of the video signal as rectified by diode 55 charge filter capacitor 57 to a voltage proportional to the average of the rectified high frequency components. Since this average voltage is derived from relatively sporadic high frequency video information, and due to the discharging action of bleeder resistor 58, capacitor 57 is normally unable to charge to a voltage level sufficient to forward bias the base-emitter junction of transistor 52 to render transistor 52 conductive.

The voltage developed at the base of transistor 52 increases significantly in the presence of the high density signals when relatively continuous stream of high frequency components of sufficient amplitude is present in the output from terminal 15, since the high density high frequency signals charge capacitor 57 faster than it can be discharged by bleeder resistor 58. When the base voltage exceeds the base-emitter threshold conduction level of transistor 52 (approximately 0.7 volts), transistor 52 is forward biased into conduction. Transistor 52 then conducts collector current through resistor 65 of contrast control circuit 60, and the collector voltage of transistor 52 and thereby the contrast control voltage appearing at the wiper of potentiometer 62 decrease in accordance with the level of conduction of transistor 52. The reduced contrast control voltage developed at the wiper of potentiometer 62 is of a magnitude and direction to cause the gain control circuits coupled to terminal 16 within unit 17 to reduce the amplitude of the video signal by a corresponding amount. Accordingly, the amplitude of the output signal from terminal 10 of unit 17 is attenuated a corresponding amount. The amount by which the signal gain is reduced under these conditions can be tailored by inserting a resistor of appropriate value in series with the collector of transistor 52.

The attenuated signal from terminal 10 of unit 17 corresponds to luminance information plus noise in the case of a weak video signal, or noise alone when the receiver is tuned to a vacant channel, for example. In either case, the attenuated signal from terminal 10 serves to prevent output amplifiers 22, 25 and 30 (FIG. 1) from being damaged due to overload under the abnormal high frequency signal conditions, since the signal drive to these amplifiers is reduced. All three video output stages are protected in this manner since the output signal from unit 17 is coupled via luminance processor 19 to matrix 20 (FIG. 1), where it is combined with the color difference signals to generate the R, G and B signals which drive output amplifiers 22, 25 and 30. That is, the controlled signal from terminal 10 of unit 17 is common to all three output amplifiers.

The arrangement of protection circuit 50 also provides a degree of temperature compensation. Illustratively, a temperature rise common to the output video driver stages and to protection circuit 50 increases the gain and therefore the dissipation of the video driver stages, and also increases the gain of control transistor 52. The latter effect in turn serves to reduce the video signal amplitude and thereby the drive level to the video output stages.

Figure 3:
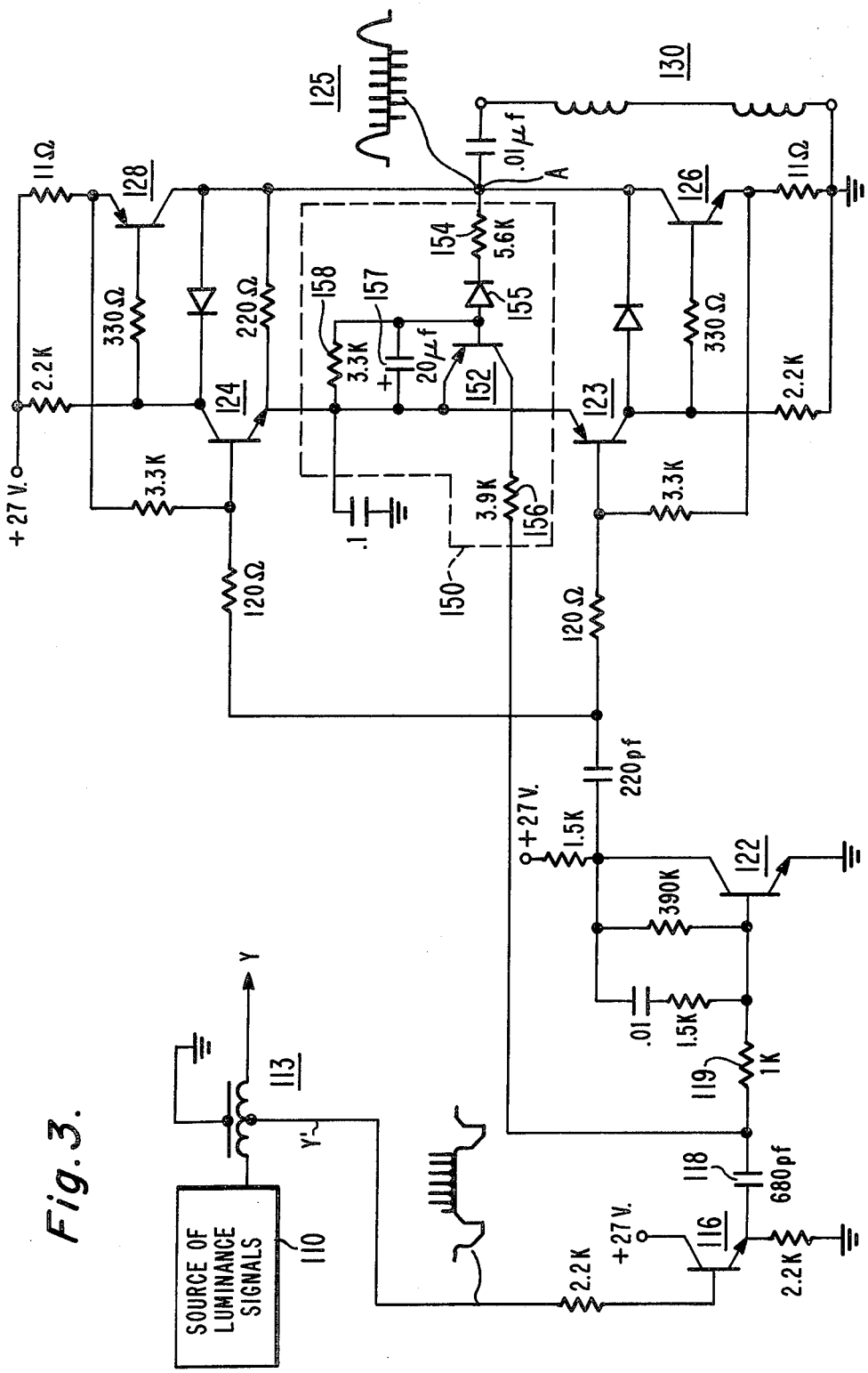
FIG. 3 shows a circuit embodiment of an alternative use of a protection circuit according to the invention.

Referring now to FIG. 3, there is shown an alternative embodiment of the present invention in a circuit which provides image enhancement by means of kinescope beam current velocity modulation in a television receiver. This method of image enhancement is not essential to an understanding of the principals of the invention as applied to the arrangement of FIG. 3, and therefore will be discussed only briefly.

In FIG. 3, luminance signals (Y) from a source 110 are coupled to luminance signal processing circuits of the receiver via a conventional luminance delay line 113 which provides a signal delay within a range of 400–700 nanoseconds. A luminance signal Y' derived from a tap on delay line 113 is buffered by an emitter follower transistor 116, differentiated by a capacitor 118 and coupled via a resistor 119 to a common emitter preamplifier transistor 122. An amplified version of the differentiated luminance signal appears at a collector output of transistor 122, from which it is A.C. coupled to a low power push-pull video amplifier 125 comprising Class C complementary conductivity type input transistors 123, 124 and complementary conductivity type output transistors 126, 128 all arranged as shown.

The output signal from transistor 122 is applied to base inputs of transistors 123 and 124, and an amplified output signal appears at a point A in the interconnected collector electrodes of output transistors 126 and 128. This signal is then used to drive a small auxiliary yoke coil 130 located beneath the main yoke on the neck of the television receiver kinescope (not shown). In this example, the system is arranged such that the signal appearing at point A comprises positive going line retrace pulses generated by the deflection circuits, and amplified, differentiated pulses of positive and negative polarity (developed by the differentiator action of capacitor 118) disposed between adjacent positive retrace pulses.

Since amplifier 125 amplifies a differentiated luminance signal, only the black to white and the white to black amplitude transitions of the luminance signal are amplified by amplifier 125. These transitions and the associated high frequency components occur sporadically under normal program conditions. Amplifier transistors 123, 124 and 126, 128 therefore conduct only for very short periods during each horizontal image line, which permits low power transistors to be used for these transistors. Transistors suitable for use as transistors 123 and 124 include types 2N4126 and 2N4124, and transistors suitable for use as transistors 126 and 128 include types MPS6531 and MPS6534, respectively.

As in the case of the video output stages of FIG. 2, when amplifier 125 is supplied with an abnormal input signal such as may contain a significant amount of nonsporadic, high frequency components occurring with a high density of duration, the amplifier transistors can be caused to conduct almost continuously for the duration of the abnormal signal. This causes the power dissipation of these transistors to increase, thereby increasing the likelihood that these transistors will be destroyed due to overheating and the attendant phenomenon of thermal runaway. A protection circuit 150 is included to prevent this from occurring. Circuit 150 in large part is structurally and operationally similar to protection circuit 50 shown in FIG. 2.

In circuit 150, a sample of the output signal appearing at point A is coupled via a resistor 154 to a rectifier diode 155. In this example, diode 155 rectifies the negative-going portion of the output signal rather than the more positive portion of the signal. This approach is preferable in this example, since the negative portion of the signal does not contain the positive retrace pulse which is generated during the horizontal flyback intervals and induced into auxiliary yoke 130. Due to the presence of the positive retrace pulse, the more positive portion of the signal is less useful for noise sensing purposes compared to the system of FIG. 2.

The rectified signal from diode 155 charges an integrator capacitor 157 to a voltage proportional to the average of the rectified signal. Capacitor 157 and a bleeder resistor 158 are coupled in parallel across the base-emitter junction of a normally non-conductive PNP control transistor 152 (e.g., type 2N4126). Under normally expected signal conditions, the charge developed on capacitor 157 at the base electrode of transistor 152 is insufficient to forward bias transistor 152 to conduct, due to the sporadic nature of the high frequency content of a normal video signal and the bleeder action of resistor 158, as mentioned in connection with FIG. 2.

In the presence of significant amounts of the high density signals, however, capacitor 157 charges faster than it can be discharged via resistor 158, and develops a voltage sufficient to cause transistor 152 to conduct. The collector current of conductive transistor 152 flows through a resistor 156 and resistor 119 to supply additional base current drive to pre-amplifier transistor 122. This additional base current causes transistor 122 to saturate, thereby attenuating or limiting the output signal at the collector of transistor 122. The pulsed output signal at point A and thereby the input to protection circuit 150 decreases until an equilibrium condition is reached, at which transistor 152 conducts sufficiently to hold the signal at point A at a maximum predetermined level. This result is obtained while the abnormal condition persists, after which transistor 152 reverts to the normal cut-off state.

The level of the signal at point A is determined by the values of resistors 154 and 158 and capacitor 157. An increasing signal at point A causes the voltage developed across resistors 154 and 158 to increase, which in turn increases the conduction of transistor 152 and transistor 122 which saturates, thereby reducing the collector output signal of transistor 122 by the limiting action of transistor 122. Resistors 154 and 158 comprise a voltage divider such that when the value of resistor 154 is increased for a given value of resistor 158, the signal at point A is permitted to increase to a higher level before the threshold conduction level of transistor 152 is reached. Capacitor 157 serves to integrate the signal pulses appearing at the base of transistor 152 to thereby prevent sporadic signals from forward biasing transistor 152.

Resistor 156 serves as a current limiting resistor to protect transistor 122 if control transistor 152 fails. For example, if a kinescope arc destroys transistor 152 by causing a short-circuit in the base-emitter or base-collector junctions of transistor 152, resistor 156 will limit the base current of transistor 122, which could otherwise increase to a potentially destructive level.

The limited output signal from transistor 122 limits the conduction of the transistors comprising amplifier stage 125 to a level sufficient to ensure that these transistors will not be damaged or destroyed due to excessive dissipation. As a specific example, under normal signal conditions, it has been observed that the average power dissipation of output stage 125 is approximately 0.35 watts. With the antenna disconnected from the receiver to simulate an interrupted signal transmission or a vacant channel, the dissipation rises to seven watts and increases with time in the absence of protection circuit 150. With protection circuit 150 installed, the power dissipation is limited to an acceptable, constant 1.3 watts.

Temperature compensation is also provided in this example. Specifically, a temperature induced increase in the gain and attendant dissipation of video amplifier stage 125 increases the level of the signal monitored by protection circuit 150. The current conduction of control transistor 152 increases in response to this signal, whereby transistor 152 supplies additional temperature induced base current drive to pre-amplifier transistor 122. This current is in a direction to oppose the effect of the signal current supplied to transistor 122, and serves to reduce the signal gain of transistor 122 and thereby the dissipation of output stage 125.

In sum, an uncomplicated, economical and energy efficient overload protection circuit has been described. No special components such as high power transistors are required, and no power is consumed under normal operating conditions, since the protection circuit control transistor (e.g., transistor 152 in FIG. 3) is normally nonconductive. Moreover, a system employing the described protection circuit can utilize video output transistors without heatsinks which would otherwise be required to compensate for excessive power dissipation caused by the adverse signal conditions mentioned previously.

Although the invention has been described with reference to particular embodiments, various additional modifications can be made within the scope of the invention.

For example, with regard to the FIG. 2 embodiment, the protection circuit could be arranged to monitor the output signal appearing at terminal 10 of unit 17, instead of the signal appearing at terminal 15 of processor 17, in accordance with the requirements of a particular system. In the latter instance, the effect of the contrast and brightness controls upon the output video signal at terminal 10 does not alter the operation of the described protection circuit.

It may also be desirable to arrange the protection circuit in a manner so as to monitor noise for a "noise squelch" application, where the signal includes high density, high frequency components independent of image signals during the line interval. This can be accomplished by monitoring the output of sync separator 42, which contains no image information.

What is Claimed is:

1. In a video signal processing system including a video signal transmission path including a video signal amplifier, said video amplifier being undesirably susceptible to excessive conduction and dissipation when the input signal thereto contains high frequency components of a significant magnitude and with a high density of occurrence, protection apparatus comprising:
   means coupled to said signal path and selectively responsive to high frequency signals for deriving a signal indicative of the presence of high frequency signals;
   controllable conduction means coupled to said signal deriving means and responsive to said derived signal for providing an output control signal when said derived signal exceeds a given level indicative of the presence of said high frequency components of a significant magnitude and with a high density of occurrence; and
   means for coupling said control signal to said video signal path to vary the signal gain thereof and thereby the level of signal coupled via said signal path in a direction to reduce the magnitude of said coupled signal, whereby the conduction and dissipation of said amplifier in response to said high density high frequency components is correspondingly reduced.

2. Apparatus according to claim 1, wherein said signal deriving means includes:
   signal differentiating means coupled to said signal path for selectively passing high frequency signal components;
   amplitude responsive means coupled to said differentiating means for passing a given polarity of signals from said differentiating means; and
   means for integrating signals of said given polarity from said amplitude responsive means, for developing said derived signal.

3. Apparatus according to claim 2, wherein:
   said integrating means comprises a charge storage device; and
   said signal deriving means additionally includes means for discharging said device at a given rate.

4. Apparatus according to claim 2, wherein:
   said amplitude responsive means comprises a rectifier coupled between said differentiating means and said integrating means.

5. Apparatus according to claim 1, wherein:
   said controllable conduction means comprises a normally nonconductive transistor, said transistor being rendered conductive in response to said derived signal for providing said output control signal when said derived signal exceeds a given level.

6. Apparatus according to claim 1, wherein:
   said signal deriving means is coupled to said video amplifier for sensing video output signals from said amplifier.

7. Apparatus according to claim 1, wherein:
   said signal path includes means disposed therein prior to said amplifier for selectively coupling high frequency components of said video signal to said amplifier; and
   said signal deriving means is coupled to said signal path subsequent to said frequency selective means.

8. In a color television signal processing system including an image reproducing kinescope having a plurality of intensity control electrodes, a television signal transmission path for coupling television signals to said kinescope, a plurality of video signal amplifiers included in said signal path for supplying amplified color representative television signals to respective control electrodes of said kinescope, said video amplifiers being undesirably susceptible to excessive conduction and dissipation when the input signals thereto contain high frequency components of a significant magnitude and with a high density of occurrence, protection apparatus comprising:
   means coupled to said signal path and selectively responsive to high frequency signals for deriving a signal indicative of the presence of high frequency signals;
   controllable conduction means coupled to said signal deriving means and responsive to said derived signal for providing an output control signal when said derived signal exceeds a given level indicative of the presence of said high frequency components of a significant magnitude and with a high density of occurrence; and
   means for coupling said control signal to said signal path to vary the signal gain thereof and thereby the level of signals coupled via said signal path in a direction to reduce the magnitude of said coupled signals, whereby the conduction and dissipation of said amplifiers in response to said high density high frequency components is correspondingly reduced.

9. Apparatus according to claim 8, wherein:
   said signal path includes luminance and chrominance channels for respectively processing luminance and chrominance signal components of said television signal; and
   said sensing means is coupled to said luminance channel for deriving a signal indicative of the presence of said high density high frequency components in said luminance signal.

* * * * *